United States Patent
Xie et al.

(10) Patent No.: US 11,939,666 B2
(45) Date of Patent: Mar. 26, 2024

(54) METHODS AND APPARATUS FOR PRECLEANING AND TREATING WAFER SURFACES

(71) Applicant: APPLIED MATERIALS, INC., Santa Clara, CA (US)

(72) Inventors: Xiangjin Xie, Fremont, CA (US); Carmen Leal Cervantes, Mountain View, CA (US); Feng Chen, San Jose, CA (US); Lu Chen, Cupertino, CA (US); Wenjing Xu, San Jose, CA (US); Aravind Kamath, San Jose, CA (US); Cheng-Hsiung Matthew Tsai, Cupertino, CA (US); Tae Hong Ha, San Jose, CA (US); Alexander Jansen, San Jose, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 892 days.

(21) Appl. No.: 16/889,017

(22) Filed: Jun. 1, 2020

(65) Prior Publication Data
US 2021/0371972 A1 Dec. 2, 2021

(51) Int. Cl.
*C23C 16/56* (2006.01)
*C23C 14/56* (2006.01)
(Continued)

(52) U.S. Cl.
CPC ...... *C23C 14/564* (2013.01); *H01J 37/32082* (2013.01); *H01L 21/02043* (2013.01); *H01L 21/67017* (2013.01); *H01J 2237/022* (2013.01)

(58) Field of Classification Search
CPC ............ H01L 21/02068; H01L 21/321; H01L 21/02043; H01L 21/76814;
(Continued)

(56) References Cited

U.S. PATENT DOCUMENTS

2003/0139005 A1* 7/2003 Song ............... H01L 21/02205
257/E21.28
2006/0000411 A1* 1/2006 Seo .................. C23C 16/45544
438/758
(Continued)

OTHER PUBLICATIONS

International Search Report and Written Opinion for PCT/US2021/029601 dated Aug. 20, 2021.
(Continued)

*Primary Examiner* — Yuechuan Yu
(74) *Attorney, Agent, or Firm* — MOSER TABOADA

(57) ABSTRACT

Methods and apparatus for processing a substrate include cleaning and self-assembly monolayer (SAM) formation for subsequent reverse selective atomic layer deposition. An apparatus may include a process chamber with a processing volume and a substrate support including a pedestal, a remote plasma source fluidly coupled to the process chamber and configured to produce radicals or ionized gas mixture with radicals that flow into the processing volume to remove residue or oxides from a surface of the substrate, a first gas delivery system with a first ampoule configured to provide at least one first chemical into the processing volume to produce a SAM on the surface of the substrate, a heating system located in the pedestal and configured to heat a substrate by flowing gas on a backside of the substrate, and a vacuum system fluidly coupled to the process chamber and configured to control heating of the substrate.

15 Claims, 4 Drawing Sheets

(51) Int. Cl.
   *H01J 37/32* (2006.01)
   *H01L 21/02* (2006.01)
   *H01L 21/67* (2006.01)

(58) Field of Classification Search
   CPC ......... H01L 21/02063; H01L 21/67017; H01L 21/68742; C23C 16/45544; C23C 16/0236; C23C 16/466; C23C 14/564; H01J 37/32082; H01J 2237/022
   See application file for complete search history.

(56) References Cited

U.S. PATENT DOCUMENTS

| | | |
|---|---|---|
| 2007/0196011 A1 | 8/2007 | Cox et al. |
| 2009/0308318 A1 | 12/2009 | Chen et al. |
| 2010/0173495 A1 | 7/2010 | Thakur et al. |
| 2013/0152857 A1* | 6/2013 | Wright ................ C23C 16/4482 137/271 |
| 2013/0157409 A1 | 6/2013 | Vaidya et al. |
| 2015/0056723 A1 | 2/2015 | Lazovsky et al. |
| 2015/0093862 A1 | 4/2015 | Nainani et al. |
| 2017/0098540 A1 | 4/2017 | Xie et al. |
| 2017/0229289 A1 | 8/2017 | Lubomirsky et al. |
| 2019/0301009 A1 | 10/2019 | Kaufman-Osborn et al. |

OTHER PUBLICATIONS

Adriaan J. M. Mackus,* Marc J. M. Merkx, and Wilhelmus M. M. Kessels, From the Bottom-Up: Toward Area-Selective Atomic Layer Deposition with High Selectivity, Department of Applied Physics, Eindhoven University of Technology, P. O. Box 513, 5600 MB Eindhoven, The Netherlands, DOI: 10.1021/acs.chemmater. 8b03454 Chem. Mater. 2019, 31, 2-12.

* cited by examiner

METHODS AND APPARATUS FOR PRECLEANING AND TREATING WAFER SURFACES

FIELD

Embodiments of the present principles generally relate to semiconductor chambers used in semiconductor processes.

BACKGROUND

Process chambers configured to perform a preclean process are configured to remove native oxide on metal contact pads of a substrate prior to depositing one or more barrier layers on the substrate and to remove other materials. Preclean chambers, typically, use ion bombardment (induced by RF plasma) to remove the native oxide on metal contacts by etching the native oxide, or use radicals (generated by remote plasma) to reduce metal with chemical reaction from the substrate. The preclean process lowers contact resistance of the metal contacts on the substrate to enhance performance and power consumption of integrated circuits on the substrate and to promote adhesion. To perform a plasma cleaning process, a substrate comprising an integrated circuit is placed in a remote plasma chamber and a pump removes most of the air from the chamber. Electromagnetic energy (e.g., radio frequency) is applied to an injected gas in a remote plasma source, such as argon or hydrogen, to excite the injected gas into a plasma state. The plasma releases ions or radicals that removes contaminants and/or material from the substrate surface. Atoms or molecules of the contaminants and/or substrate material are etched from the substrate and are, for the most part, pumped out of the chamber. However, the inventors have observed that when the substrate is to be subsequently moved to an atomic layer deposition (ALD) chamber for barrier layer deposition, the substrate is not adequately prepared for selective type ALD depositions.

Thus, the inventors have provided improved methods and apparatus to prepare the substrate for selective type ALD depositions.

SUMMARY

Methods and apparatus for wafer precleaning and wafer preparation for selective type ALD depositions are provided herein.

In some embodiments, an apparatus for processing a substrate may comprise a process chamber with a processing volume and a substrate support including a pedestal to support the substrate, a remote plasma source (RPS) fluidly coupled to the process chamber and configured to produce radicals or ionized gas mixture with radicals that flow into the processing volume to remove residue or oxides from a surface of the substrate, a first gas delivery system configured to provide at least one first chemical into the processing volume to produce a self-assembled monolayer (SAM) on the surface of the substrate, a heating system located in the pedestal and configured to heat a substrate by flowing gas on a backside of the substrate, and a vacuum system fluidly coupled to the process chamber and configured to control heating of the substrate.

In some embodiments, the apparatus may further include wherein the first gas delivery system contains a first ampoule, wherein the first gas delivery system contains a second ampoule configured to provide at least one second chemical into the processing volume to aid in removing residue or oxide from the surface of the substrate, wherein the second ampoule contains ethanol or methanol, a second gas delivery system fluidly coupled to the RPS and configured to provide at least one gas to form ions or radicals from a plasma generated by the RPS, wherein the at least one gas is hydrogen or helium, wherein the heating system is configured to heat the substrate from approximately 60 degrees Celsius to approximately 450 Celsius to reduce oxide on the surface of the substrate, and/or wherein the at least one first chemical produces the SAM for use with reverse selective atomic layer deposition (ALD) as a blocking layer.

In some embodiments, an apparatus for modifying a surface of a substrate may comprise a process chamber configured to remove residue or oxide from the surface of the substrate with a remote plasma source (RPS) that is fluidly coupled to the process chamber and configured to produce an ionized gas mixture with radicals that flow into a processing volume of the processing chamber and a first gas delivery system with a first ampoule configured to provide at least one first chemical into the processing volume of the process chamber to produce a self-assembled monolayer (SAM) on the surface of the substrate.

In some embodiments, the apparatus may further include wherein the first ampoule contains unsaturated carbon-based compounds, a second gas delivery system fluidly coupled to the RPS and configured to provide at least one gas to form ions or radicals from a plasma generated by the RPS, wherein the at least one gas is hydrogen, a second ampoule configured to provide at least one second chemical into the processing volume of the process chamber to aid in removing residue or oxide from the surface of the substrate, wherein the second ampoule contains a primary alcohol, and/or wherein the at least one first chemical produces the SAM for use with reverse selective atomic layer deposition (ALD) as a blocking layer.

In some embodiments, a method for processing a substrate may comprise removing residue or oxides from a surface of the substrate in a process chamber with radicals produced from a remote plasma source (RPS) and, without an air break and within the process chamber, forming a blocking layer with a first chemical from a first ampoule fluidly connected to the process chamber on at least a portion of the surface of the substrate to protect at least one bottom portion of structure on the substrate during a subsequent reverse selective atomic layer deposition (ALD) process.

In some embodiments, the method may further include wherein the first chemical is an unsaturated carbon compound, flowing a second chemical from a second ampoule fluidly connected to the process chamber to aid in removing residue or oxides from the surface of the substrate in conjunction with the radicals from the RPS, wherein the second chemical is an alcohol, and/or wherein the radicals are hydrogen radicals.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
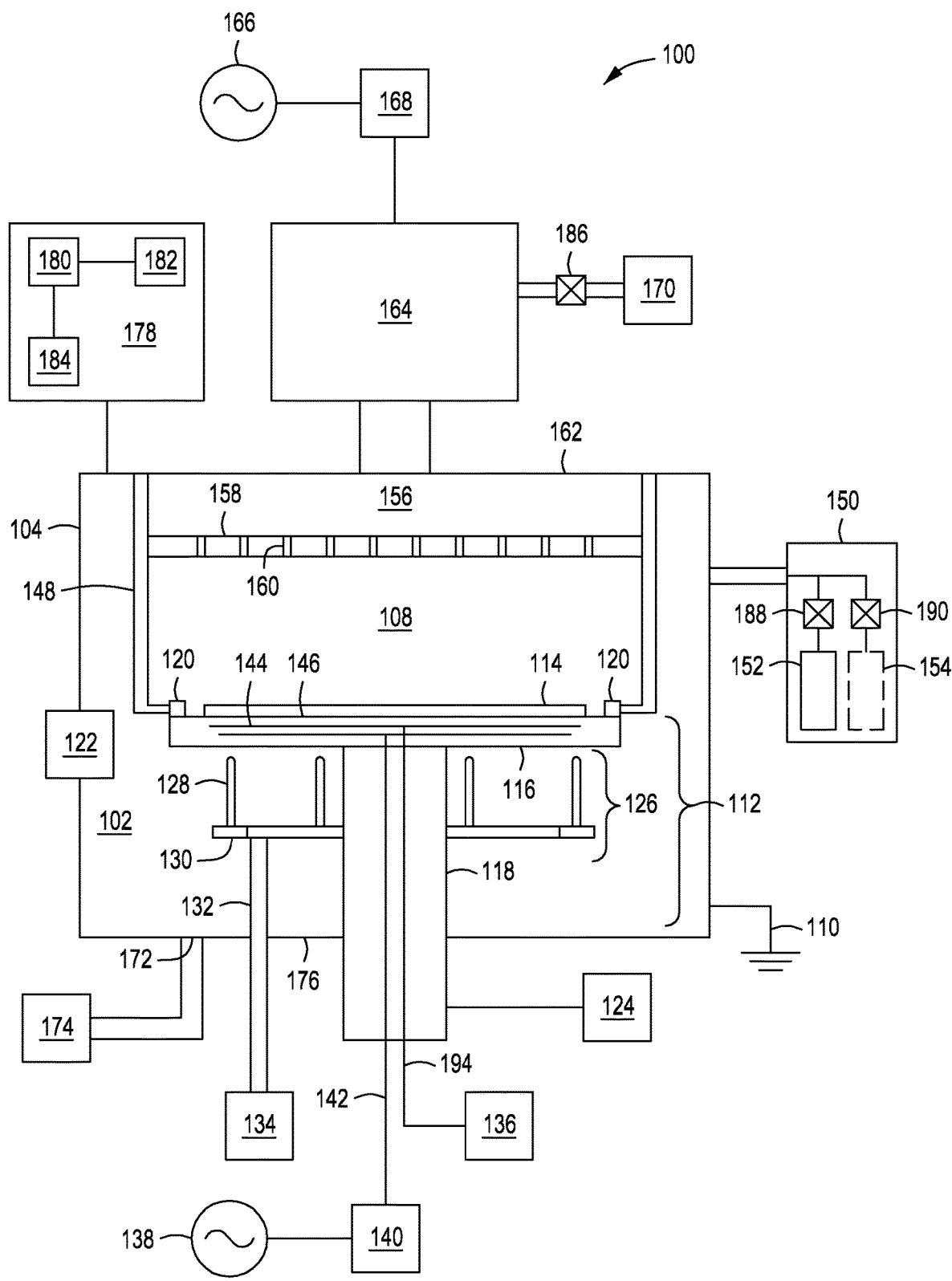
FIG. 1 depicts a cross-sectional view of a preclean chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide an integrated single chamber solution that is configured for the precleaning (PC) of wafers and for self-assembled monolayer (SAM) deposition on wafers for selective type ALD depositions. The PCSAM™ chamber increases throughput and reduces costs by providing an integrated solution for metal surface cleaning and surface modification prior to atomic layer deposition. Current interconnect via fill is challenging with very limited space for copper or other metals. Barrier and line thin down is relevant to reduce resistive-capacitive (RC) delay. A via's bottom thickness should be zero or near zero. To achieve a zero or near zero bottom thickness, reverse selective deposition of ALD between the sides and the bottom of the via is desired (e.g., deposition is desired on a via's side wall while no or limited deposition occurs on the via's bottom). The PCSAM™ chamber enables subsequent reverse selective ALD by providing an integrated preclean and metal passivation layer formation system to improve the RC delay of contacts such as, for example, vias.

In some embodiments, the PCSAM™ chamber may include a remote plasma source (RPS) to provide an active reducing agent like, but not limited to, hydrogen or helium, a heater to control temperature of the wafer during processing, a vacuum system to control wafer heat-up and plasma control, at least one ampoule to provide at least one chemical for metal reduction and/or surface modification (e.g., SAM and/or surface repair), a gas delivery system, and a process cavity to enable a controllable process. In some embodiments, the processing includes heating the incoming wafer, removing residue and/or reduction of metal oxides with minimal or no substrate damage, and/or application of a blocking agent to enable reverse selective ALD.

FIG. 1 depicts a cross-sectional view of a preclean chamber 100 having an integrated surface modification capability. The preclean chamber 100 is a vacuum chamber which is adapted to maintain sub-atmospheric pressures within an interior volume 102 during substrate processing. In some embodiments, the preclean chamber 100 can maintain a pressure of approximately 1 mTorr to 100 Torr. The preclean chamber 100 includes a chamber body 104 which encloses a processing volume 108 located in the upper half of the interior volume 102. The chamber body 104 may be made of metal, such as aluminum and the like. The chamber body 104 may be grounded via a coupling to ground 110.

A substrate support 112 is disposed within the interior volume 102 to support and retain a substrate 114, such as a semiconductor wafer, for example, or other such substrate. The substrate support 112 may generally comprise a pedestal 116 and a hollow support shaft 118 for supporting the pedestal 116. The pedestal 116 may be composed of an aluminum-based material or a ceramic-based material and the like. A pedestal formed of a ceramic-based material may be used for high temperature processes. The hollow support shaft 118 provides a conduit to provide, for example, backside gases, process gases, fluids, coolants, power, or the like, to the pedestal 116. In some embodiments, the substrate support 112 includes a focus ring 120 disposed about the pedestal 116 to enhance process uniformity at an edge of the substrate 114. In some embodiments, the focus ring 120 is made of quartz-based materials. In some embodiments, the focus ring 120 is made of ceramic-based materials. The ceramic-based material facilitates high pressure process capabilities. A slit valve 122 may be coupled to the chamber body 104 to facilitate in transferring the substrate 114 into and out of the interior volume 102.

In some embodiments, the hollow support shaft 118 is coupled to a lift actuator 124, such as a motor, which provides vertical movement of the pedestal 116 between an upper, processing position, and a lower, transfer position. A substrate lift 126 can include lift pins 128 mounted on a platform 130 connected to a shaft 132 which is coupled to a second lift actuator 134 for raising and lowering the substrate lift 126 so that the substrate 114 may be placed on or removed from the pedestal 116. The pedestal 116 may include through-holes to receive the lift pins 128. The hollow support shaft 118 provides a path for a gas conduit 194 for coupling a backside gas supply 136 and/or an RF power supply 138 to the pedestal 116. In some embodiments, the RF power supply 138 provides bias power through a matching network 140 to a power conduit 142 to the pedestal 116. In some embodiments, RF energy supplied by the RF power supply 138 may have a frequency of about 2 MHz or greater. In some embodiments, the RF power supply 138 may have a frequency of about 13.56 MHz.

In some embodiments, the backside gas supply 136 is disposed outside of the chamber body 104 and supplies gas to the pedestal 116. In some embodiments, the pedestal 116 includes a gas channel 144, allowing gas to interact with a backside of the substrate 114 to maintain a given temperature. The gas channel 144 is configured to provide backside gas, such as nitrogen (N), argon (Ar), or helium (He), to an upper surface 146 of the pedestal 116 to act as a heat transfer medium. The gas channel 144 is in fluid communication with the backside gas supply 136 via gas conduit 194 to control the temperature and/or temperature profile of the substrate 114 during use. For example, the backside gas supply 136 can supply gas to cool and/or heat the substrate 1114 during use. In some embodiments, the substrate 114 may be heated from approximately 60 degrees Celsius to approximately 450 degrees Celsius. The heating of the substrate 114 enhances the cleaning processes, especially with metals such as, but not limited to, tungsten and cobalt.

The preclean chamber 100 includes a process kit circumscribing various chamber components to prevent unwanted reaction between such components and etched material and other contaminants. The process kit includes an upper shield 148. In some embodiments, the upper shield 148 may be made of metal, such as aluminum. In some embodiments, the process kit may be constructed of quartz. In some embodiments, the preclean chamber 100 is also coupled to and in fluid communication with a gas delivery system 150 which may supply one or more precursor gases to the preclean chamber 100 for processing a substrate disposed therein. In some embodiments, the gas delivery system 150 may include one or more ampoules such as a first ampoule 152 and an optional second ampoule 154 to provide chemicals for metal reduction (e.g., oxide removal, etc.) and/or surface modification (blocking layer or SAM, etc.). The chemical flow from the first ampoule 152 is controlled by a first flow valve 188 and the chemical flow from the optional second ampoule 154 is controlled by a second flow valve 190. In some embodiments, the first ampoule 152 contains chemicals used to produce a blocking layer for reverse selective ALD processes. In some embodiments, the first ampoule 152 may be heated and deliver a SAM precursor directly into the processing volume 108. In some embodiments, the first ampoule 152 may be at a room temperature (non-heated) and use a carrier gas to deliver a SAM precursor into the processing volume 108. The SAMs are surface chemistry based and, in some embodiments, are selected to interact with metallic surfaces on the substrate 114. In some embodiments, the first ampoule 152 contains SAM compounds such as, but not limited to, alkynes or other unsaturated carbon-based compounds. In some embodiments, the optional second ampoule 154 may contain chemicals, such as, but not limited to, alcohols such as ethanol, methanol, that are used to facilitate in residue removal and/or oxide from the substrate 114. In some embodiments, the substrate 114 may be heated during the residue and/or oxide removal process.

A showerhead 158 is located above the processing volume 108 and below a ceiling 162 of the chamber body 104k, forming a plenum 156 above the showerhead 158. The showerhead 158 includes through-holes 160 to flow gases from the plenum 156 into the processing volume 108. An RPS 164 is fluidly connected to the plenum 156 to allow ionized gases to flow from the RPS 164 into the plenum 156, through the showerhead 158, and into the processing volume 108. Plasma is generated in the RPS by a plasma RF power source 166 that provides RF energy through a matching network 168 to the RPS 164. Process gases used to form the plasma are supplied by a process gas source 170 and controlled by a third flow valve 186. The plasma gases supplied by the process gas source 170 may include, but are not limited to, hydrogen, helium, and/or argon and the like. The RPS 164 produces radicals of the process gas to facilitate in cleaning residues and/or oxides from the substrate 114 to remove etching residue and/or to reduce metal oxides from the surface of the substrate 114. In some embodiments, rather than having the gas delivery system 150, the process gas source 170 may also provide cleaning chemicals into the processing volume 108 to facilitate in the removal of residue and/or oxides on the substrate 114 and also provide a carrier gas for a SAM precursor to form a blocking layer on the substrate 114.

A pump port 172 is configured to facilitate removal of particles from the interior volume 102. The preclean chamber 100 is coupled to and in fluid communication with a vacuum system 174 which includes a throttle valve (not shown) and pump (not shown) which are used to exhaust the preclean chamber 100. In some embodiments, the vacuum system 174 is coupled to the pump port 172 disposed on a bottom surface 176 of the chamber body 104. The pressure inside the preclean chamber 100 may be regulated by adjusting the throttle valve and/or vacuum pump. In some embodiments, the pump has a flow rate of about 1900 liters per second to about 3000 liters per second. In some embodiments, the vacuum system 174 may be used to facilitate in regulating the substrate temperature.

In some embodiments, a controller 178 is used for the operation of the preclean chamber 100. The controller 178 may use direct control of the preclean chamber or alternatively, use indirect control of the preclean chamber by controlling computers (or controllers) associated with the preclean chamber 100. In operation, the controller 178 enables data collection and feedback from the preclean chamber 100 to optimize performance of the preclean chamber 100. The controller 178 generally includes a Central Processing Unit (CPU) 180, a memory 182, and a support circuit 184. The CPU 180 may be any form of a general-purpose computer processor that can be used in an industrial setting. The support circuit 184 is conventionally coupled to the CPU 180 and may comprise a cache, clock circuits, input/output subsystems, power supplies, and the like. Software routines, such as a method as described below may be stored in the memory 182 and, when executed by the CPU 180, transform the CPU 180 into a specific purpose computer (controller 178). The software routines may also be stored and/or executed by a second controller (not shown) that is located remotely from the preclean chamber 100.

The memory 182 is in the form of computer-readable storage media that contains instructions, when executed by the CPU 180, to facilitate the operation of the semiconductor processes and equipment. The instructions in the memory 182 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
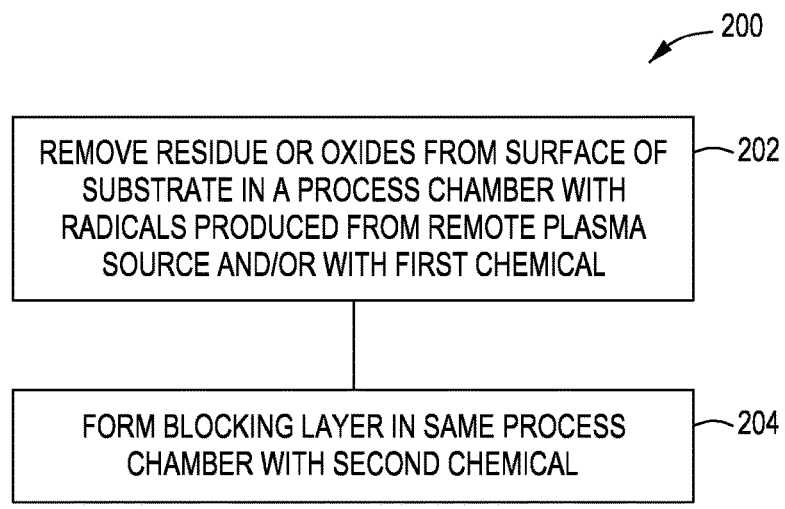
FIG. 2 is a method of processing a substrate in a preclean chamber in accordance with some embodiments of the present principles.
Figure 3:
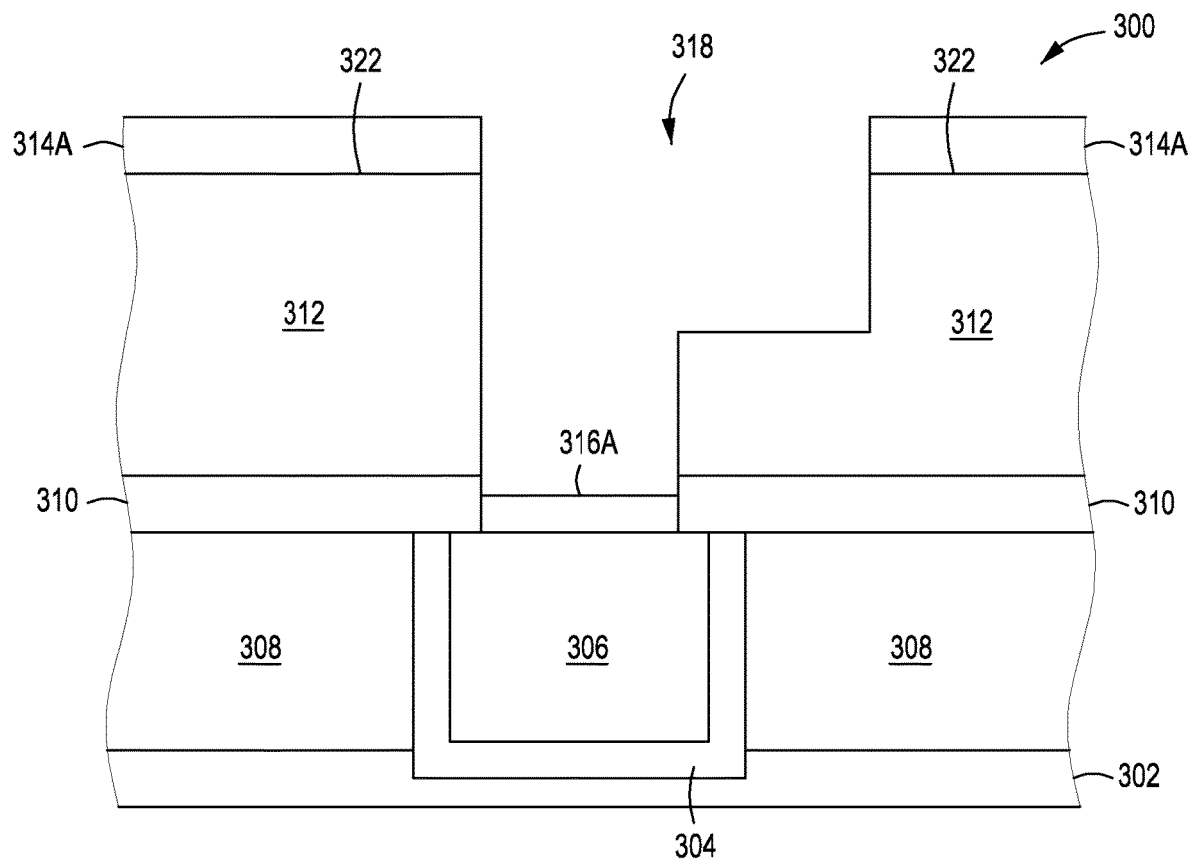
FIG. 3 depicts a cross-sectional view of a substrate with oxide on a surface in accordance with some embodiments of the present principles.

FIG. 2 is a method 200 of processing a substrate in a preclean chamber in accordance with some embodiments. In block 202, residue and/or oxides are removed from a surface of a substrate in a process chamber with radicals produced from a remote plasma source and/or with a first chemical. In some embodiments, the first chemical is provided by, for example, the optional second ampoule 154 of FIG. 1. In some embodiments, the first chemical is provided via a process gas source 170 of a remote plasma system such as, for example, RPS 164 of FIG. 1. The first chemical may comprise of one or more additional cleaning chemicals such as, for example, ethanol or methanol to facilitate in cleaning difficult surfaces such as tungsten or cobalt and the like. For an example, a substrate with a copper contact will be used to illustrate the method 200, but the example is not meant to be limiting in any manner. FIG. 3 is a view 300 of a cross-section of a substrate 302 that is to be cleaned by the preclean chamber 100. A first low-k dielectric layer 308 of the substrate 302 has an embedded copper contact 306 surrounded by a copper barrier layer 304 to prevent migration of the copper into the first low-k dielectric layer 308. An intermediate layer 310 separates the first low-k dielectric layer 308 form a second low-k dielectric layer 312. The second low-k dielectric layer 308 has an oxide layer 314A formed on an upper surface 322. The substrate 302 has been previously etched to open a via 318 in the substrate 302. The embedded copper contact 306 has subsequently oxidized forming a copper oxide layer 316A at a bottom of the via 318.

Figure 4:
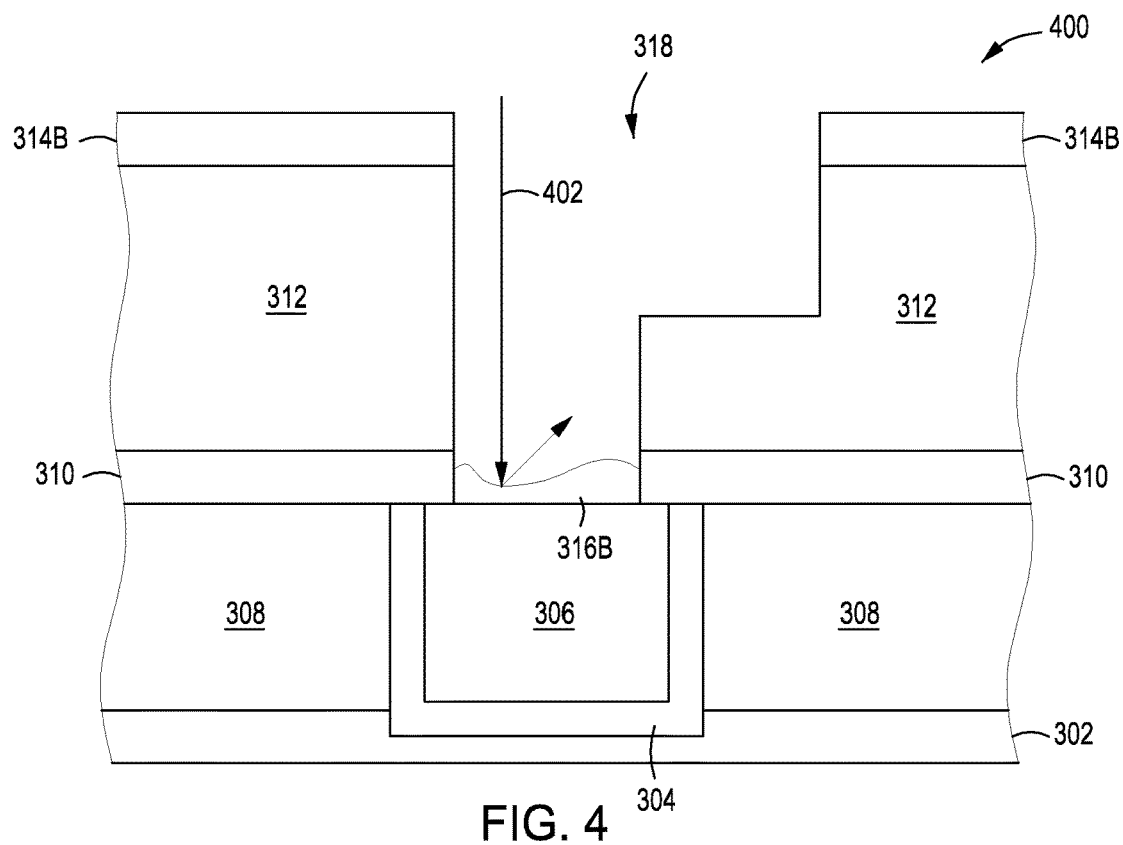
FIG. 4 depicts a cross-sectional view of a substrate being cleaned in accordance with some embodiments of the present principles.
Figure 5:
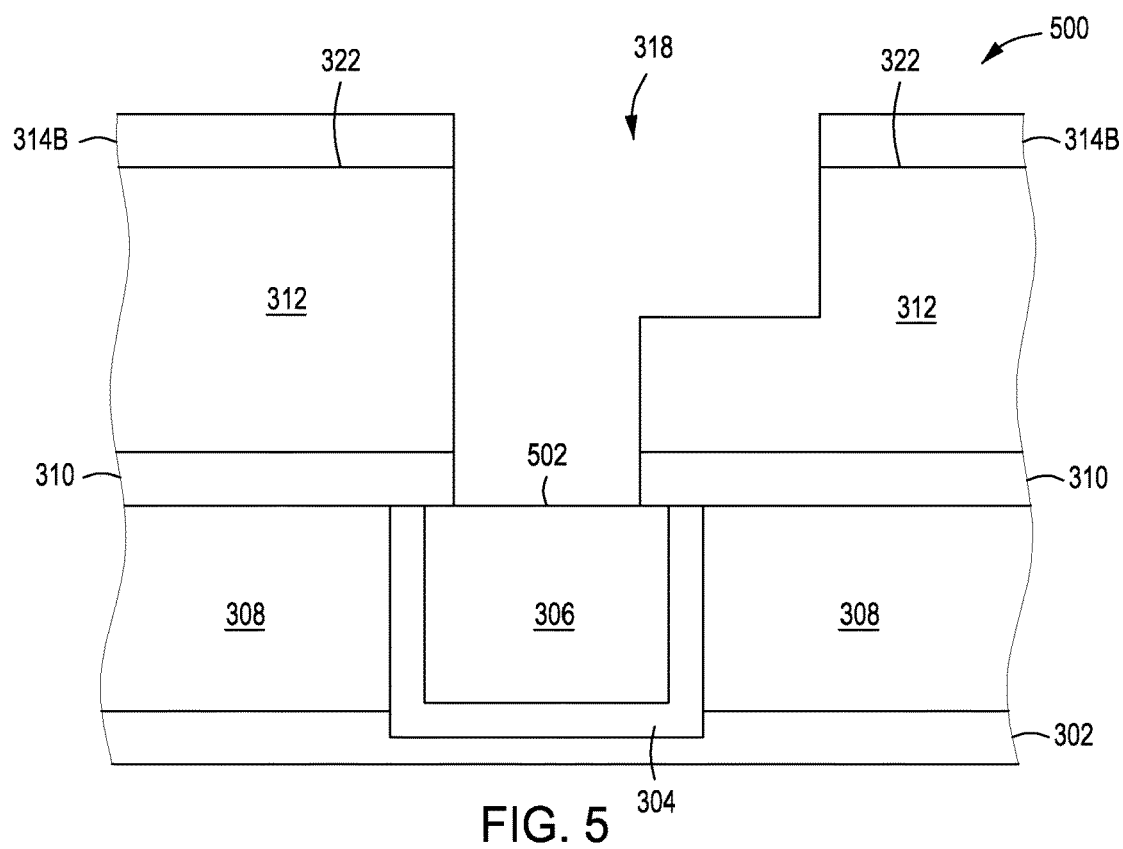
FIG. 5 depicts a cross-sectional view of a substrate after cleaning in accordance with some embodiments of the present principles.

In a cross-sectional view 400 of FIG. 4, the substrate 302 is treated with radicals 402, such as, but not limited to, hydrogen radicals, from ionized gases generated by plasma in the RPS 164. The radicals are directed down onto the substrate 302 in the processing volume 108. The contaminant or residue 316B has been diminished by the etching effect of the radicals 402. The oxide layer 314B will also be reduced by the radicals 402. In some embodiments, the contact may be formed of a metal material that may not be completely cleaned by radical treatment alone (e.g., tungsten, cobalt, etc.). An additional cleaning chemical may be injected into the processing volume 108 to facilitate in cleaning the substrate. The additional cleaning chemical may be, but not limited to, ethanol or methanol and the like. In some embodiments, the additional cleaning chemical may be provided by the process gas source 170 via the RPS 164 or directly into the processing volume 108 by the optional second ampoule 154. The cleaning process will continue until the residue or oxide has been removed from the embedded copper contact 306. In a cross-sectional view 500 of FIG. 5, a surface 502 of the embedded copper contact 306 has been cleaned of any residue or oxide and is ready for further processing.

Figure 6:
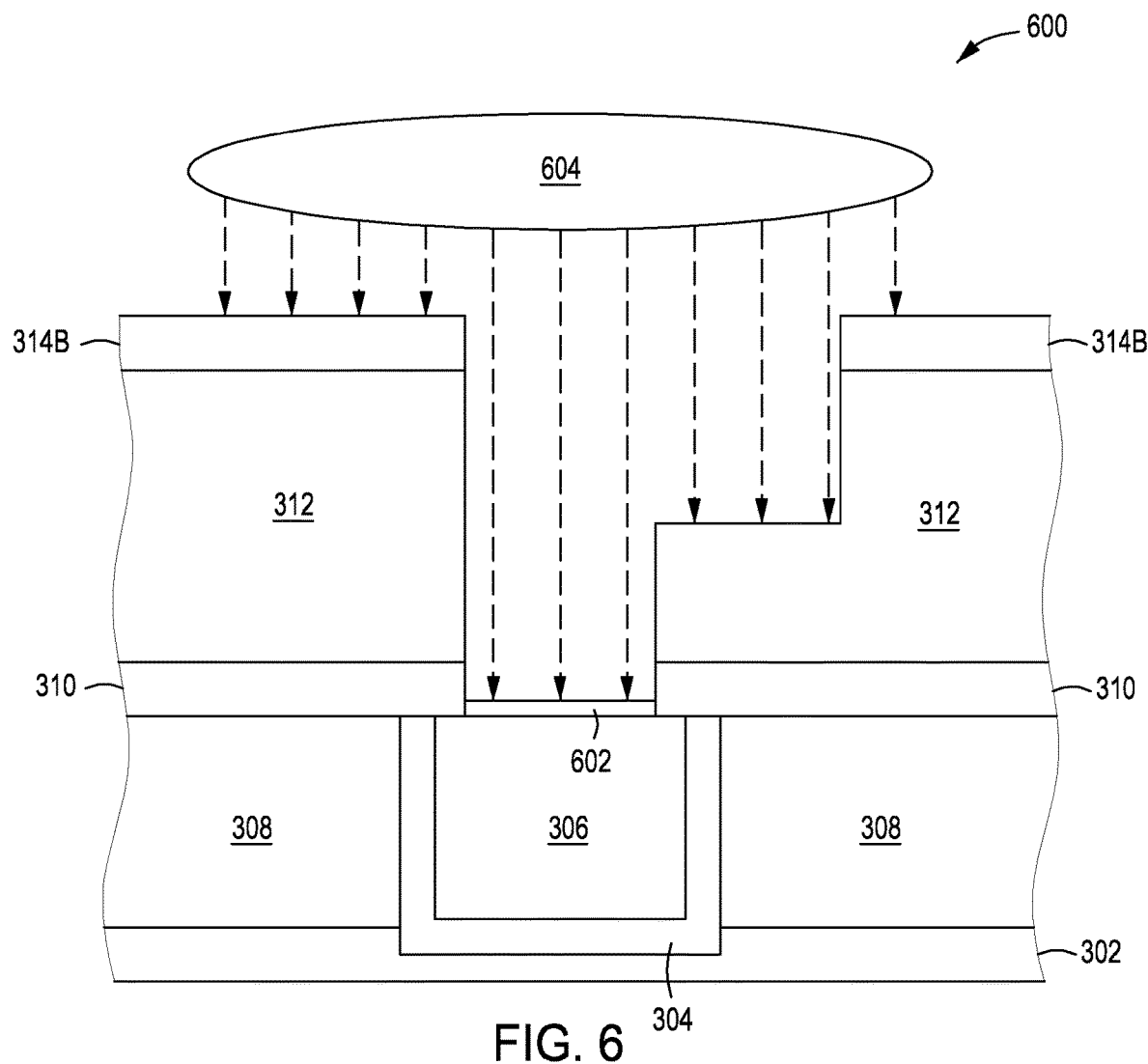
FIG. 6 depicts a cross-sectional view of substrate during formation of a self-assembled monolayer in accordance with some embodiments of the present principles.

In block 204, a blocking layer is formed in the same process chamber as the residue and/or oxide removal by using a second chemical. The blocking layer is formed without an air break between the precleaning process and the formation of the blocking layer in the same preclean chamber 100. In some embodiments, the chemical is a SAM precursor provided by, for example, the first ampoule 152 of FIG. 1 directly into the processing volume 108. In some embodiments, the SAM precursor is heated before being delivered into the processing volume 108. In some embodiments, the chemical is a carrier gas for a SAM precursor provided by the process gas source 170 of FIG. 1 via the RPS 164. In some embodiments, the SAM precursor is non-heated (room temperature). In a cross-sectional view 600 of FIG. 6, the substrate 302 is exposed to a SAM precursor 604 in the processing volume 108. The SAM precursor 604 may be provided by the process gas source 170 at room temperature (unheated) or by the first ampoule 152 which may include preheating of the SAM precursor 604. The SAM precursor 604 is selected such that the SAM precursor aligns (builds a monolayer) on the given metal used for the contact such as the embedded copper contact 306 to form a blocking layer 602 or gas phase surfactant on the metal surface. The blocking layer 602 is used in subsequent selective reverse ALD processes to form barrier layers (not shown) on the side walls and non-contact surfaces of the via 318. The blocking layer 602 prevents formation of the barrier layer on the bottom of the via, keeping the contact free from material.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for processing a substrate, comprising: a process chamber with a processing volume and a substrate support including a pedestal to support the substrate, wherein the pedestal is a ceramic-based material; a remote plasma source (RPS) fluidly coupled to a top of the process chamber and configured to produce radicals or ionized gas mixture with radicals that flow into the processing volume to remove residue or oxides from a surface of the substrate via a plenum and showerhead positioned at the top of the process chamber; a first gas delivery system fluidly connected directly to the processing volume via a sidewall of the process chamber and configured to provide at least one first chemical into the processing volume to produce a self-assembled monolayer (SAM) on the surface of the substrate; a heating system located in the pedestal and configured to heat a substrate by flowing gas on a backside of the substrate; a vacuum system fluidly coupled to the process chamber and configured to control heating of the substrate; and a controller configured to generate radicals or ionized gas mixture with radicals with the RPS to remove residue or oxides from the surface of the substrate and then to form a blocking layer on a metal contact with the self-assembled monolayer on the surface of the substrate by delivering the at least one first chemical into the processing volume from the first gas delivery system.

2. The apparatus of claim 1, wherein the first gas delivery system contains a first ampoule, wherein the first gas delivery system is configured to heat the first ampoule.

3. The apparatus of claim 2, wherein the first gas delivery system contains a second ampoule configured to provide at least one second chemical into the processing volume to aid in removing residue or oxide from the surface of the substrate.

4. The apparatus of claim 3, wherein the second ampoule contains an alcohol.

5. The apparatus of claim 1, further comprising:
a second gas delivery system fluidly coupled to the RPS and configured to provide at least one gas to form ions or radicals from a plasma generated by the RPS.

6. The apparatus of claim 5, wherein the at least one gas includes a carrier gas for the at least one first chemical.

7. The apparatus of claim 1, wherein the heating system is configured to heat the substrate from approximately 60 degrees Celsius to approximately 450 Celsius to reduce oxide on the surface of the substrate.

8. The apparatus of claim 1, wherein the at least one first chemical produces the SAM for use with reverse selective atomic layer deposition (ALD) as a blocking layer.

9. An apparatus for modifying a surface of a substrate, comprising: a process chamber configured to remove residue or oxide from the surface of the substrate with a remote plasma source (RPS) that is fluidly coupled to a top of the process chamber and configured to produce an ionized gas mixture with radicals that flow into a processing volume of the process chamber via a plenum and showerhead positioned at the top of the process chamber; and a first gas delivery system with a first ampoule connected to a sidewall of the process chamber and configured to provide at least one first chemical directly into the processing volume of the process chamber to produce a self-assembled monolayer (SAM) on the surface of the substrate.

10. The apparatus of claim 9, wherein the first ampoule contains unsaturated carbon-based compounds.

11. The apparatus of claim 9, further comprising:
a second gas delivery system fluidly coupled to the RPS and configured to provide at least one gas to form ions or radicals from a plasma generated by the RPS.

12. The apparatus of claim 11, wherein the at least one gas includes a carrier gas for the at least one first chemical of the first ampoule.

13. The apparatus of claim 9, further comprising:
a second ampoule in the first gas delivery system configured to provide at least one second chemical directly into the processing volume of the process chamber to aid in removing residue or oxide from the surface of the substrate.

14. The apparatus of claim 13, wherein the second ampoule contains an alcohol.

15. The apparatus of claim 9, wherein the at least one first chemical produces the SAM for use with reverse selective atomic layer deposition (ALD) as a blocking layer.

* * * * *